United States Patent
Lin et al.

(10) Patent No.: US 8,289,727 B2
(45) Date of Patent: Oct. 16, 2012

(54) PACKAGE SUBSTRATE

(75) Inventors: Chin-Sung Lin, Banqiao (TW); Li-Hua Lin, Kaohsiung (TW); Yu-Yu Lin, Wujie Township (TW)

(73) Assignees: Taiwan Semiconductor Manufacturing Company, Ltd., Hsin-Chu (TW); Global Unichip Corp., Hsin-Chu (TW)

(*) Notice: Subject to any disclaimer, the term of this patent is extended or adjusted under 35 U.S.C. 154(b) by 237 days.

(21) Appl. No.: 12/814,102

(22) Filed: Jun. 11, 2010

(65) Prior Publication Data

US 2011/0304998 A1  Dec. 15, 2011

(51) Int. Cl.
*H05K 7/00* (2006.01)
*H05K 1/11* (2006.01)

(52) U.S. Cl. ........ 361/783; 361/760; 361/772; 174/255; 174/260; 174/261

(58) Field of Classification Search ........................ None
See application file for complete search history.

(56) References Cited

U.S. PATENT DOCUMENTS

| | | | |
|---|---|---|---|
| 4,651,417 A | 3/1987 | Schumacher, III et al. | |
| 5,424,492 A * | 6/1995 | Petty et al. | 174/250 |
| 5,434,750 A * | 7/1995 | Rostoker et al. | 361/784 |
| 5,451,721 A | 9/1995 | Tsukada et al. | |
| 5,847,936 A | 12/1998 | Forehand et al. | |
| 6,000,124 A | 12/1999 | Saito et al. | |
| 6,011,695 A * | 1/2000 | Dumke | 361/777 |
| 6,329,604 B1 | 12/2001 | Koya | |
| 6,404,649 B1 | 6/2002 | Drake et al. | |
| 6,631,838 B2 | 10/2003 | Kim et al. | |
| 6,710,255 B2 * | 3/2004 | Ross et al. | 174/255 |
| 6,713,879 B2 * | 3/2004 | Akram et al. | 257/778 |
| 6,751,113 B2 * | 6/2004 | Bhakta et al. | 365/63 |
| 6,804,119 B2 * | 10/2004 | Ziemkowski | 361/715 |
| 6,818,836 B2 | 11/2004 | Shiraishi et al. | |
| 6,839,964 B2 | 1/2005 | Henson | |
| 7,001,834 B2 * | 2/2006 | Devnani et al. | 438/599 |
| 7,655,872 B2 * | 2/2010 | Chen et al. | 174/262 |
| 8,049,116 B2 * | 11/2011 | Lee et al. | 174/260 |
| 2010/0051341 A1 * | 3/2010 | Cheng et al. | 174/261 |
| 2010/0181101 A1 * | 7/2010 | Han et al. | 174/260 |

* cited by examiner

*Primary Examiner* — Boris Chervinsky

(74) *Attorney, Agent, or Firm* — Slater & Matsil, L.L.P.

(57) ABSTRACT

In accordance with an embodiment, a substrate layout comprises a ground plane of a first power loop on a layer of a substrate, a first trace rail on the layer extending along a first periphery of the ground plane, and a first perpendicular trace coupled to the first trace rail. The ground plane is between the first trace rail and a die area, and the first perpendicular trace extends perpendicularly from the first trace rail. The first trace rail and the first perpendicular trace are components of a second power loop.

15 Claims, 6 Drawing Sheets

PACKAGE SUBSTRATE

TECHNICAL FIELD

The present disclosure relates generally to a package substrate and a method of manufacture and, more particularly, a package substrate with a routable layer for power integrity and a method of manufacture.

BACKGROUND

Despite the packaging used for an integrated circuit or die, the die is generally bonded to an external substrate for electrical connections to other external devices or components. Similar substrates, such as printed circuit boards, have been used in the semiconductor packaging industry for various applications.

To maximize the efficient use of layers on these substrates, a single layer will typically comprise a ground plane for a first power loop and a power supply trace for a second power loop. These substrates may comprise many different power loops and may have various combinations of ground planes and power supply traces on multiple layers of the substrate. However, these typical configurations may incur problems, such as a high impedance on a power loop, as a result of how the ground plane and power supply trace may be configured on a single layer.

For example, in one layer, one typical configuration may include a ground plane for a first power loop that substantially surrounds two sides of the area where a die will be bonded to the substrate. An outer layer may comprise a ball grid array (BGA) that has power supply connections located on an outer corner of the substrate where a line between those connections the die area dissect the ground plane. Vias from these connections to the layer on which the ground plane is located may couple the power supply connections to a trace. In a typical configuration, the trace then bisects the ground plane and surrounds the die area on the same two sides that the ground plane does. Accordingly, the trace may have a "Y" configuration where the die area is situated within and between the upper branches of the "Y." Return current in the ground plane may therefore be prevented from returning in a direct path because the trace may cut off the direct path. Rather, the return current may be diverted around the trace to return to vias that couple the die.

In these configurations, the diversion of the return current typically results in an increased impedance of the power loop. The increase in impedance may also become much more pronounced in higher frequencies. Further, this may result in increased power noise that reduces the fidelity of signals in the die. Accordingly, there is a need in the art for a substrate layout that reduces or obviates these disadvantages and a method for creating such a substrate layout.

SUMMARY

In accordance with an embodiment, a substrate layout comprises a ground plane of a first power loop on a layer of a substrate, a first trace rail on the layer extending along a first periphery of the ground plane, and a first perpendicular trace coupled to the first trace rail. The ground plane is between the first trace rail and a die area, and the first perpendicular trace extends perpendicularly from the first trace rail. The first trace rail and the first perpendicular trace are components of a second power loop.

In accordance with another embodiment, a substrate layout comprises a ground plane on a layer of a substrate, a first trace rail along a first outer edge of the ground plane, and a first trace coupled to the first trace rail. The ground plane is disposed between the first trace rail and a die area. The ground plane is a component of a first power loop, and the first trace rail is a component of a second power loop. No trace that is a further component of the second power loop extends in a direction that is perpendicular to and intersects a direct path of a return current, wherein the return current flows in the ground plane to a return current structure. The return current structure is selected from a group consisting essentially of a via, a through-via, or a combination thereof.

A further embodiment is a method for forming a structure. The method comprises providing a substrate having a conductive material thereon, forming a ground plane, a first trace rail, and a first perpendicular trace from the conductive material, and forming an insulator material over the ground plane, the first trace rail, and the first perpendicular trace. The ground plane is between the first trace rail and an area of the substrate over which will be a die. The first trace rail extends along a first outer edge of the ground plane, and the first perpendicular trace is coupled to the first trace rail and extends perpendicularly from the first trace rail.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a substrate comprising wiring layers for electrical connections to an integrated circuit or die. Other embodiments may also be applied, however, to other substrates that couple an integrated circuit or die, such as interposer substrates.

Figure 1:
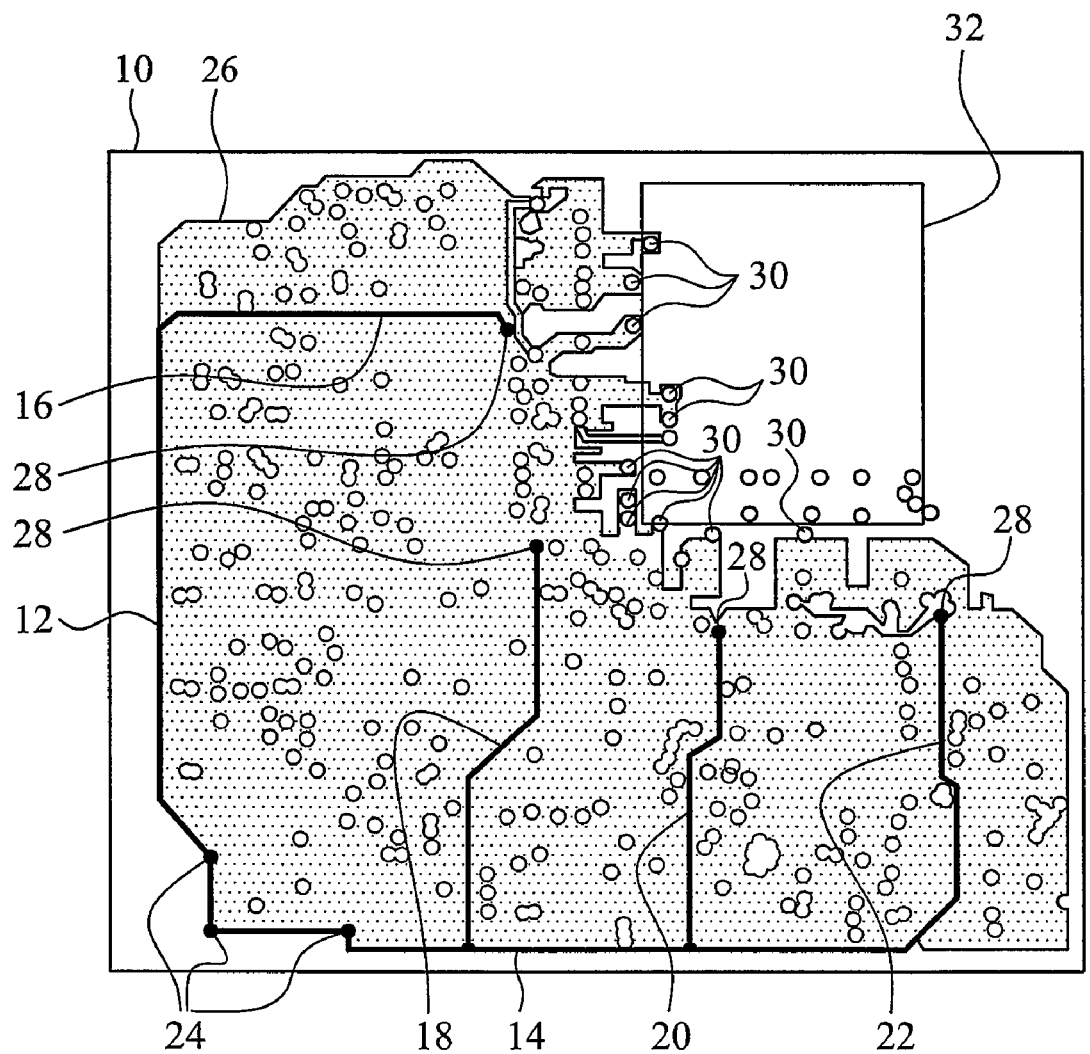
FIGS. 1-3 are intermediate layers of a substrate according to various embodiments.

FIG. 1 illustrates an intermediate layer 10 of a substrate according to an embodiment. The intermediate layer 10 may be any layer within the substrate. The intermediate layer 10 comprises a "Power B" ground plane 26. An outline of a die area 32 is shown where a die may be coupled to an exterior surface of the substrate. The die area 32 is illustrated with the ground plane 26 surrounding substantially two sides of the die area 32. Along these two sides of the die area 32 are vias 30 that electrically couple the ground plane 26 to the die once the die is coupled to the substrate.

Trace rails 12 and 14 each are along an exterior edge of the ground plane 26, and the ground plane 26 is between the trace rails 12 and 14 and the die area 32. The trace rails 12 and 14 are components of a "Power A" loop, and provide a power supply voltage or a reference voltage. Trace rail 12 extends in a first direction along an edge of the ground plane 26, while trace rail 14 extends in a second direction along another edge of the ground plane 26 that is perpendicular to the first direction. Trace rails 12 and 14 are electrically coupled to vias 24 that are electrically coupled to ball grid array (BGA) solder balls on an exterior surface of the substrate. The BGA balls may be on the same or a different surface as the die.

First, second, third, and fourth perpendicular traces 16, 18, 20, and 22, respectively, each extend perpendicularly from their respective trace rails 12 and 14 into the ground plane 26. The perpendicular traces 16, 18, 20, and 22 are further components of a "Power A" loop, and each electrically couple the trace rails 12 and 14 to a via 28 that is electrically coupled to the die. The perpendicular traces 16, 18, 20, and 22 each also extend perpendicularly to the edge of the die area 32 nearest the respective trace. It should be noted that the trace rails 12 and 14 and the perpendicular traces 16, 18, 20, and 22 are electrically isolated from the ground plane 26 such that the trace rails 12 and 14 and the perpendicular traces 16, 18, 20, and 22 are not shorted or in direct contact with the ground plane 26.

In this configuration of FIG. 1, return current flowing in the ground plane 26 may flow more directly to the vias 30 that direct the return current to the die. With the perpendicular traces 16, 18, 20, and 22 extending perpendicularly from the respective trace rails 12 or 14 and/or a die area edge nearest each respective perpendicular trace 16, 18, 20, or 22, a direct path for the return current 26 may not be cut off by any intervening trace in the "Power A" loop. In other words, no "Power A" trace in the ground plane 26 is perpendicular to a direct path for the return current in the ground plane 26 to flow, but any trace that may extend in a direction perpendicular to a direct path for the return current may extend in that direction along an outside edge of the ground plane 26. Rather, in this configuration, perpendicular traces 16, 18, 20, and 22 may extend parallel to a direct path for the return current.

In this configuration without traces in the "Power A" loop cutting off a direct flow of return current in the ground plane 26, the impedance of the "Power B" loop may be decreased, as well as the impedance of the "Power A" loop. The traces in the "Power A" loop may be lengthened in the configuration in FIG. 1 in comparison to known configurations, which may increase the resistance of the traces, but the inventors have observed that this lengthening does not adversely affect the impedance of the power loop when the advantages of this configuration are considered. The details of these observations are discussed below after the disclosure of further embodiments.

Figure 2:
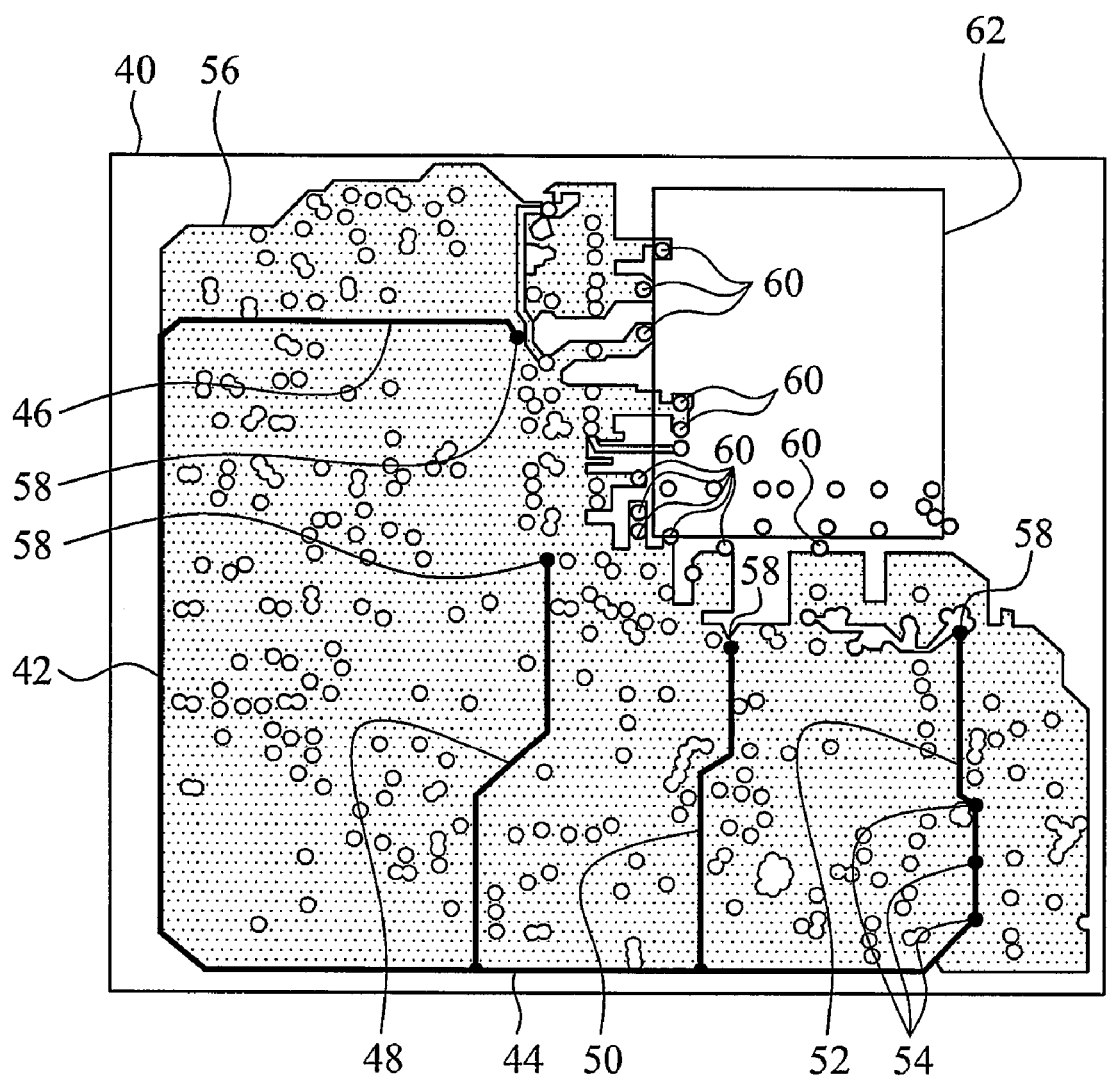

FIG. 2 illustrates an intermediate layer 40 of a substrate according to another embodiment. FIG. 2 depicts a "Power B" ground plane 56, an outline of a die area 62, and vias 60 that electrically couple the ground plane 56 to the die once it is coupled to the substrate. The die area 62 is illustrated with the ground plane 56 surrounding substantially two sides of the die area 62.

Trace rails 42 and 44 each extend along an exterior edge of the ground plane 56, and the ground plane 56 is between the trace rails 42 and 44 and the die area 62. The trace rails 42 and 44 are components of a "Power A" loop. Trace rail 42 extends in a first direction along an edge of the ground plane 56, while trace rail 44 extends in a second direction along another edge of the ground plane 56 that is perpendicular to the first direction. Trace rails 42 and 44 are electrically coupled to vias 54 that are electrically coupled to BGA balls on an exterior surface of the substrate. The BGA balls may be on the same or a different surface as the die.

Similar to FIG. 1, first, second, third, and fourth perpendicular traces 46, 48, 50, and 52, respectively, each extend perpendicularly from the respective trace rails 42 and 44 into the ground plane 56. The perpendicular traces 46, 48, 50, and 52 are further components of the "Power A" loop, and each electrically couple the trace rails 42 and 44 to a via 58 that electrically couples to the die. The perpendicular traces 46, 48, 50, and 52 each also extend perpendicularly to the edge of the die area 62 nearest the respective trace.

Figure 3:
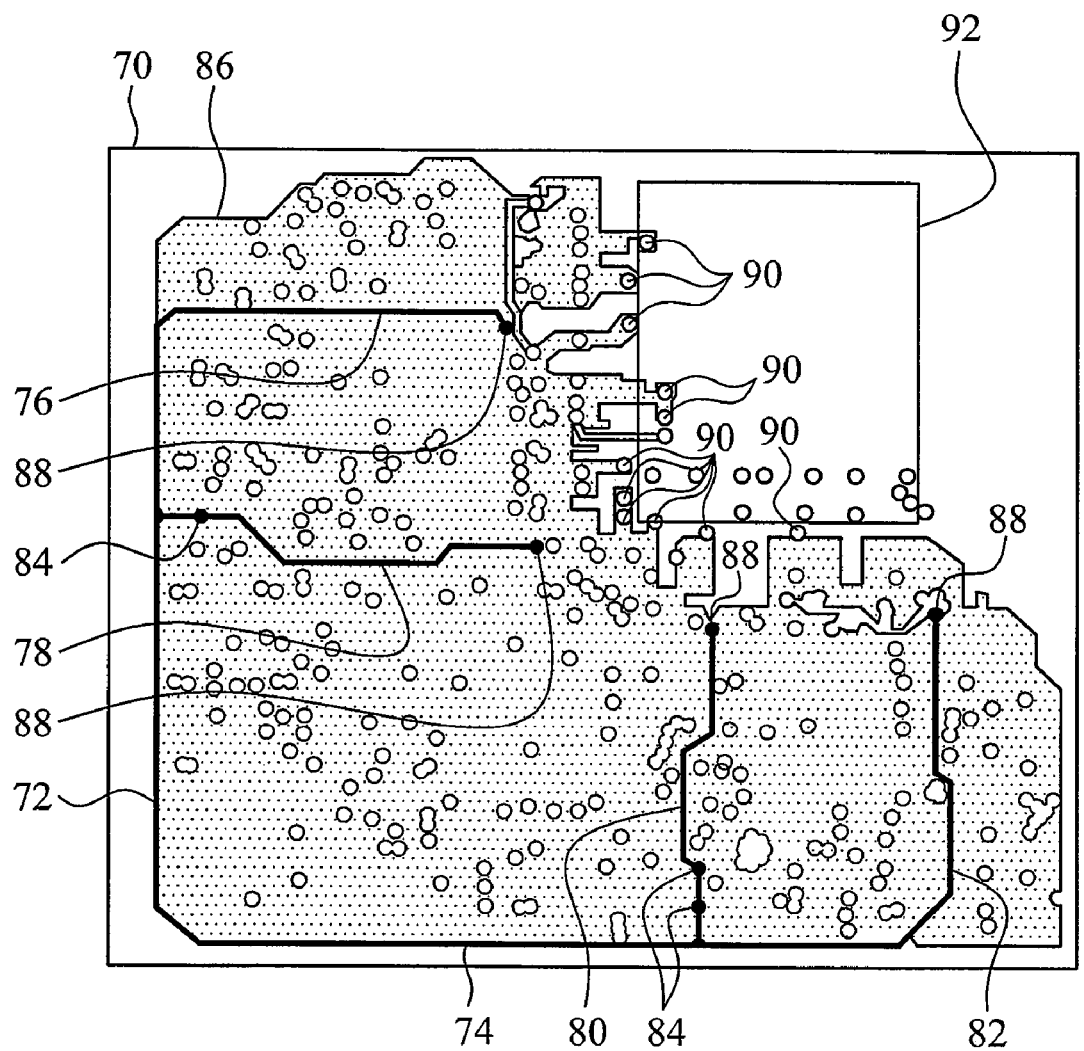

FIG. 3 illustrates an intermediate layer 70 of a substrate according to a further embodiment. FIG. 3 depicts a "Power B" ground plane 86, an outline of a die area 92, and vias 90 that electrically couple the ground plane 86 to the die once it is coupled to the substrate. The die area 92 is illustrated with the ground plane 86 surrounding substantially two sides of the die area 92.

Trace rails 72 and 74 each extend along an exterior edge of the ground plane 86, and the ground plane 86 is between the trace rails 72 and 74 and the die area 92. The trace rails 72 and 74 are components of a "Power A" loop. Trace rail 72 extends in a first direction along an edge of the ground plane 86, while trace rail 74 extends in a second direction along another edge of the ground plane 86 that is perpendicular to the first direction. Trace rails 72 and 74 are electrically coupled to vias 84 that are electrically coupled to BGA balls on an exterior surface of the substrate. The BGA balls may be on the same or a different surface as the die.

Similar to FIGS. 1 and 2, first, second, third, and fourth perpendicular traces 76, 78, 80, and 82, respectively, each extend perpendicularly from the respective trace rails 72 and 74 into the ground plane 86. The perpendicular traces 76, 78, 80, and 82 are further components of the "Power A" loop, and each electrically couple the trace rails 72 and 74 to vias 88 that electrically couple to the die. The perpendicular traces 76, 78, 80, and 82 each also extend perpendicularly to the edge of the die area 92 nearest the respective trace.

An advantage is highlighted by the differences between FIGS. 1 through 3. One advantage may be the flexibility in locating conductive balls on an exterior surface of the substrate, and in turn, the flexibility in locating vias. In FIGS. 1 through 3, the BGA balls, and thus the vias 24, 54, and 84 that are electrically coupled to BGA balls, may be placed in any arrangement. As shown in FIG. 1, the vias 24, and thus the BGA balls, are located near the joint of the trace rails 12 and 14. As shown in FIG. 2, the three vias 54 are located aligned on perpendicular trace 52. As shown in FIG. 3, two vias 84 are located aligned on perpendicular trace 80, and another via 84 is located on perpendicular trace 78. Other embodiments include other configurations of BGA balls and vias electrically coupled thereto, and this disclosure is not limited to the configurations depicted in the figures. Further, the vias are not required to be on a perpendicular trace that couples a trace rail to a via coupled to the die. Rather, the vias may be separate from these perpendicular traces, and may be coupled to any of the rail traces and/or the perpendicular traces by another trace.

Another advantage may be the flexibility in locating traces in the ground plane. Perpendicular traces may be located at any location extending through the ground plane. Further, perpendicular traces may be directly coupled to any of the rail traces. It should be noted that the perpendicular traces have been described as perpendicular to a rail trace or die area edge, or as parallel to a direct path of return current. As used herein, the terms "perpendicular" and "parallel" in these contexts refers also to minor routing variations from a line perpendicular or parallel due to any need to avoid through-vias or to any limitations on the manufacture of the substrate that prevents a trace from being parallel or perpendicular, e.g., in the manufacture of a substrate, a trace may extend only in a line that is one of four directions (an x-direction, a y-direction, a direction a positive forty-five degrees from the x-direction, and a direction a negative forty-five degrees from the x-direction).

As referenced above, embodiments may decrease the impedance of both the Power A loop and the Power B loop. The inventors have observed that the embodiments of FIGS. 1 through 3 have improved impedances over known configurations with corresponding BGA placement. With a reduced impedance in these situations, noise in the power loops or noise on signals within the die or output from the die may be reduced.

For example with respect to FIG. 1, at 266 MHz, 533 MHz, and 800 MHz, the impedance of the Power B loop in the embodiment was 0.74Ω, 1.67Ω, and 2.88Ω, respectively, which was a 67.5 percent, 75.7 percent, and 89.5 percent improvement over the known configuration, respectively. Further, the Power A loop in the embodiment had a 0.08Ω impedance at DC, which was a 42.9 percent improvement.

For example regarding FIG. 2, at 266 MHz, 533 MHz, and 800 MHz, the impedance of the Power B loop in the embodiment was 0.76Ω, 1.68Ω, and 2.70Ω, respectively, which was a 69.0 percent, 77.0 percent, and 97.7 percent improvement over the known configuration, respectively. Further, the Power A loop in the embodiment had a 0.09Ω impedance at DC, which was a 18.2 percent improvement.

For example regarding FIG. 3, at 266 MHz, 533 MHz, and 800 MHz, the impedance of the Power B loop in the embodiment was 0.79Ω, 1.73Ω, and 2.86Ω, respectively, which was a 68.4 percent, 73.8 percent, and 85.6 percent improvement over the known configuration, respectively. Further, the Power A loop in the embodiment had a 0.06Ω impedance at DC, which was a 14.3 percent improvement.

Figure 4A:
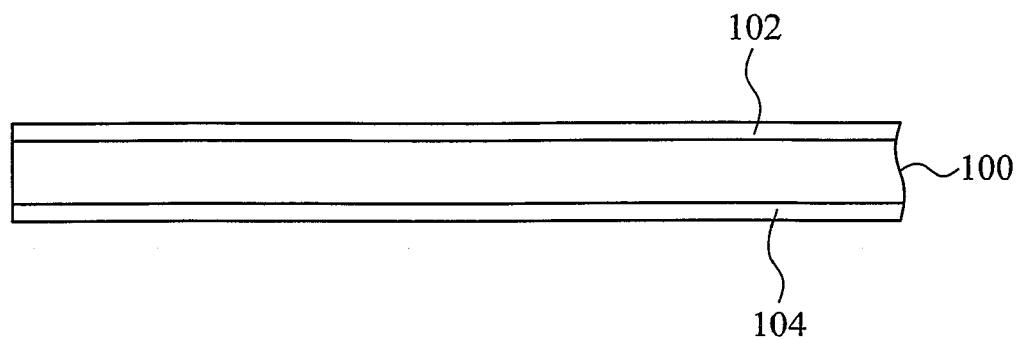
FIGS. 4A through 4H are a method to form a substrate according to another embodiment.
Figure 4B:
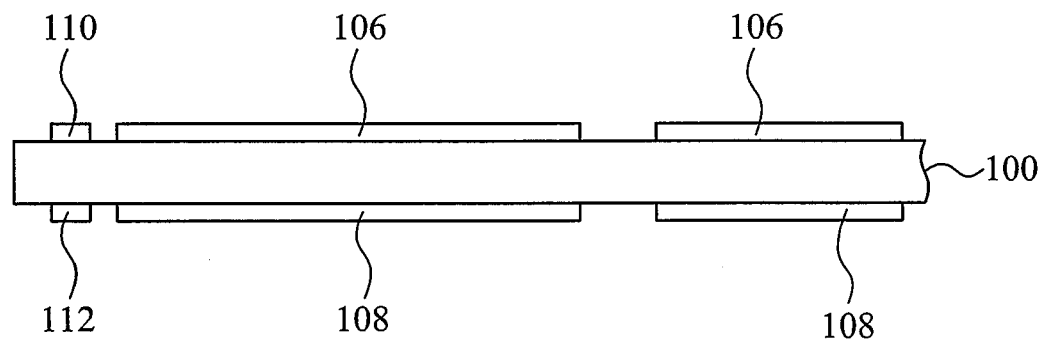
Figure 4C:
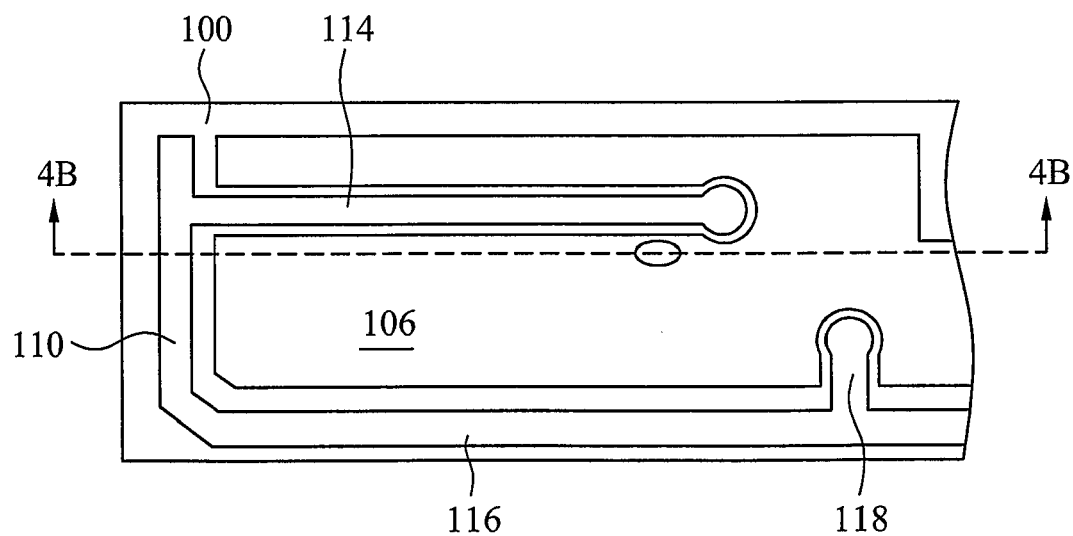

FIGS. 4A through 4H show a method to form a substrate according to another embodiment. In FIG. 4A, a core 100 is provided with a metal conductor 102 laminated on a top surface of the core 100 and another metal conductor 104 laminated on a bottom surface of the core 100. The metal conductors 102 and 104 may be copper. In FIG. 4B, the metal conductors 102 and 104 are etched to form rail traces 110 and 112 and ground planes 106 and 108. A plan view of the cross section view of FIG. 4B is shown in FIG. 4C, where the cross section in FIG. 4B is taken along line 4B-4B in FIG. 4C. FIG. 4C shows the ground plane 106, rail traces 110 and 116, and perpendicular traces 114 and 118. This layout is a simplified layout of the embodiments in FIGS. 1 through 3. Further, this layout is shown as the wiring layer on the top surface of the core 100, and a similar layout may be formed on the bottom surface of the core 100.

Figure 4D:
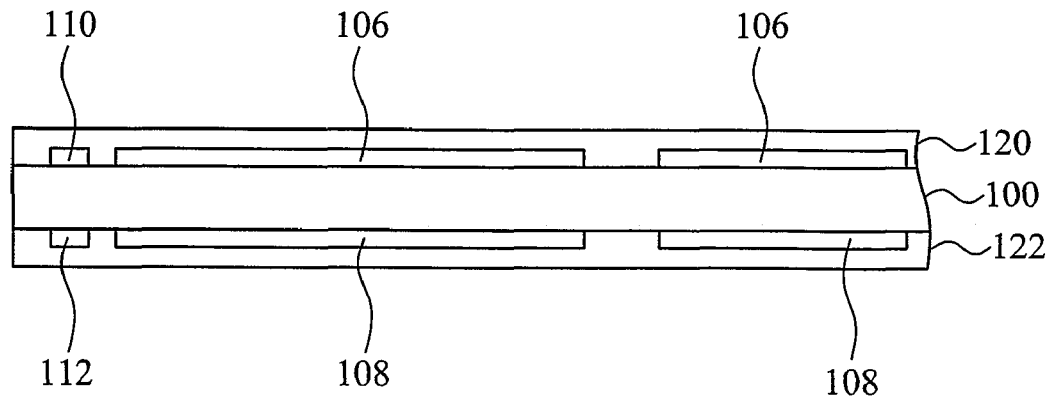
Figure 4E:
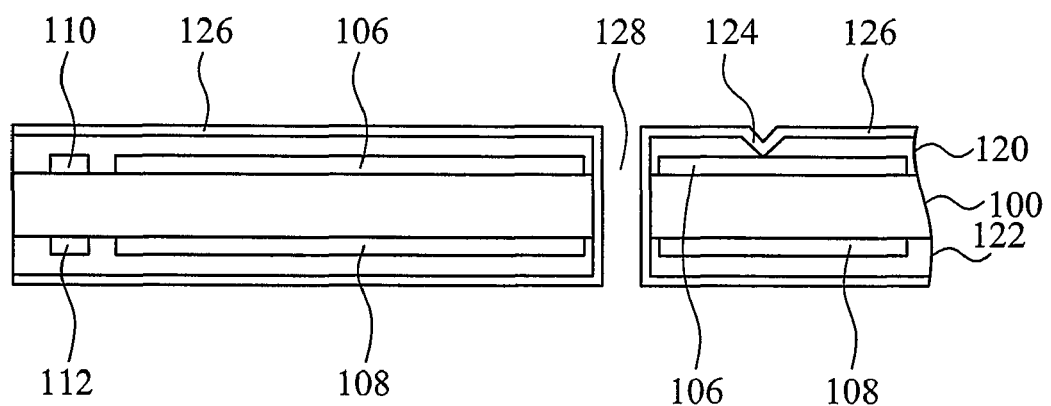
Figure 4F:
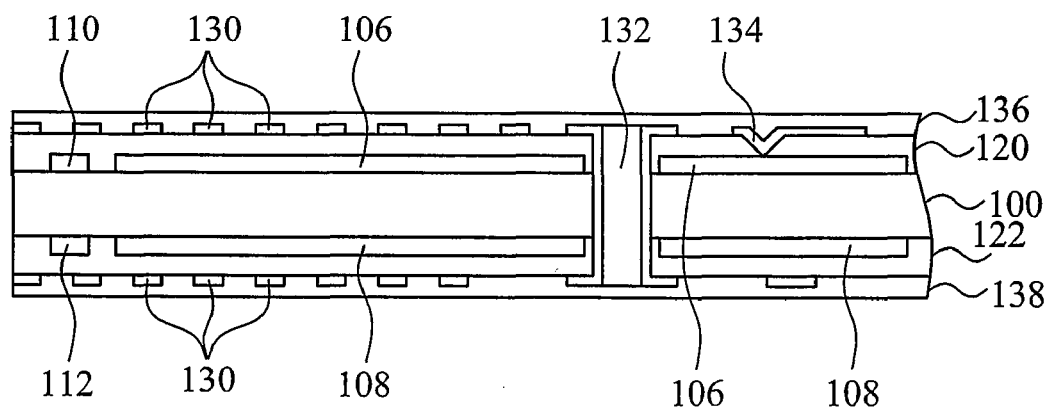

In FIG. 4D, a resin 120 is formed over the wiring layer on the top surface of the core 100, and another resin 122 is formed over the wiring layer on the bottom surface of the core 100. In FIG. 4E, a via hole 124 is etched in resin 120, and a through-via hole 128 is drilled through resin 120, the core 100, and resin 122. A metal conductor 126 is then plated over the structure. In FIG. 4F, the metal conductor 126 is etched to form signal traces 130, through-via 132, and via 134. A solder mask 136 is formed over the top of the structure, and another solder mask 138 is formed on the bottom surface.

Figure 4G:
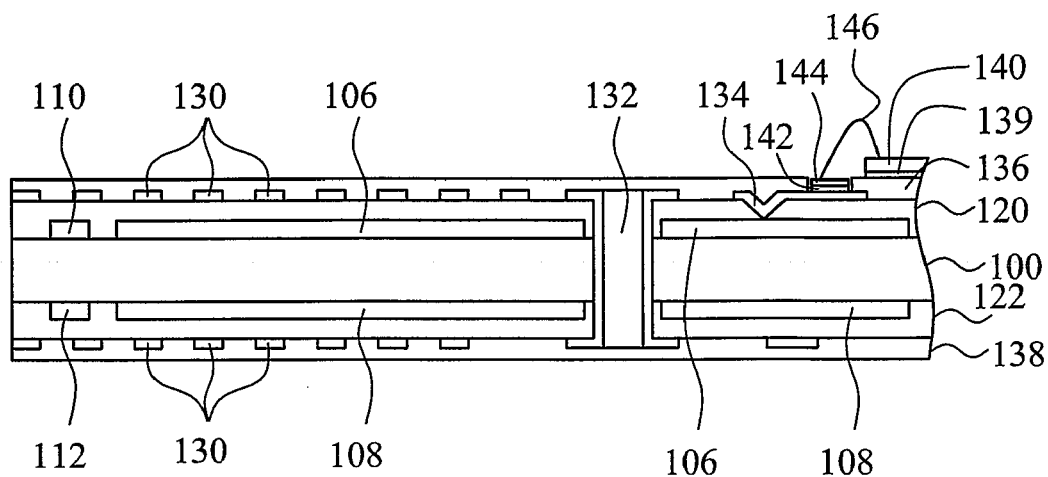
Figure 4H:
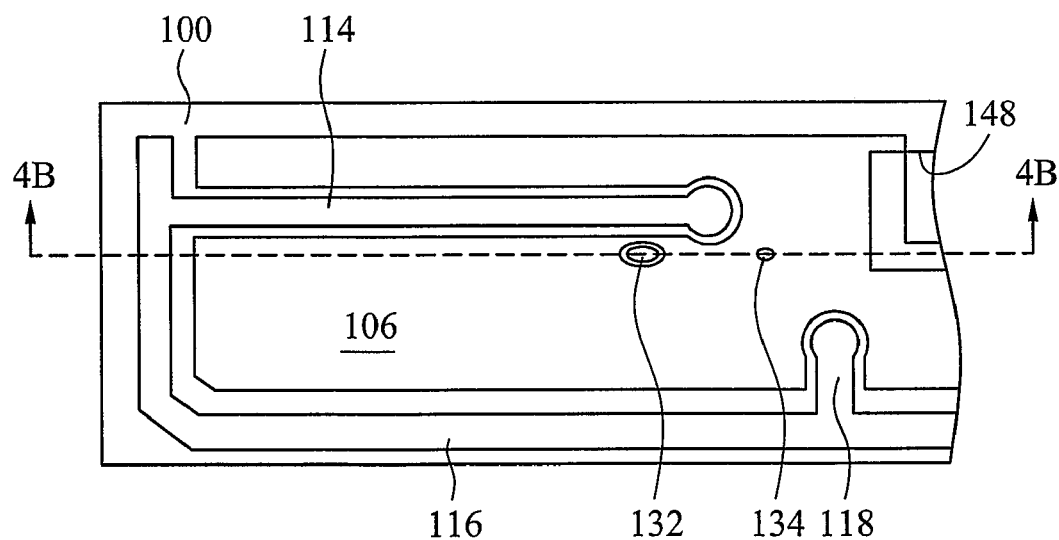

In FIG. 4G, the solder mask 136 is removed in an area over the metal conductor coupled to the via 134. A surface finish step is then performed. For example, nickel 142 and then gold 144 are plated in the removed area to form a wire bond finger. Other surface finish steps may include using electroless nickel immersion gold (ENIG), a nickel electroless palladium immersion gold (ENEPIG), or a nickel palladium layer. A die 140 is then bonded to the structure by adhesive 139. A wire 146 is then bonded between the finger and the die 140 to form an electrical connection between the structure and the die. FIG. 4H shows the metal wiring layer on the top surface of the core 100, similar to FIG. 4C. FIG. 4H further shows the through-via 132, the via, and a die area 148 that is superimposed on the layout.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A substrate layout comprising:
   a ground plane of a first power loop on a layer of a substrate;
   a first trace rail on the layer extending along a first periphery of the ground plane, wherein the ground plane is between the first trace rail and a die area; and
   a first perpendicular trace coupled to the first trace rail, and extending perpendicularly from the first trace rail, wherein the first trace rail and the first perpendicular trace are components of a second power loop.

2. The substrate layout of claim 1 further comprising:
   a second trace rail extending in a second direction along a second periphery of the ground plane, wherein the first trace rail extends in a first direction different from the second direction, wherein the first trace rail and the second trace rail are electrically coupled together; and
   a second perpendicular trace coupled to the second trace rail, and extending perpendicularly from the second trace rail.

3. The substrate layout of claim 2 further comprising a third perpendicular trace coupled to the second trace rail, and extending perpendicularly from the second trace rail.

4. The substrate layout of claim 1, wherein no trace that is a further component of the second power loop cuts off a direct flow of return current from the ground plane to a via that electrically couples the ground plane to a die.

5. The substrate layout of claim 1, wherein a via, a through-via, or a combination thereof is directly coupled to the first trace rail, and the via, the through-via, or the combination is electrically coupled to a solder ball.

6. The substrate layout of claim 1, wherein a via, a through-via, or a combination thereof is directly coupled to the first perpendicular trace, and the via, the through-via, or the combination is electrically coupled to a solder ball.

7. The substrate layout of claim 1, wherein the first perpendicular trace is directly coupled to a via, a through-via, or a combination thereof, and the via, the through-via, or the combination is electrically coupled to a finger, wherein the finger is electrically coupled to the die.

8. A substrate layout comprising:
a ground plane on a layer of a substrate, the ground plane being a component of a first power loop;
a first trace rail along a first outer edge of the ground plane, the first trace rail being a component of a second power loop, wherein the ground plane is disposed between the first trace rail and a die area; and
a first trace coupled to the first trace rail, wherein no trace that is a further component of the second power loop extends in a direction that is perpendicular to and intersects a direct path of a return current, wherein the return current flows in the ground plane to a return current structure, wherein the return current structure is selected from a group consisting essentially of a via, a through-via, or a combination thereof.

9. The substrate layout of claim 8, wherein the first trace extends perpendicularly from the first trace rail.

10. The substrate layout of claim 8 further comprising:
a second trace rail along a second outer edge of the ground plane, wherein the first outer edge and the second outer edge extend in different directions, and wherein the first trace rail and the second trace rail are electrically coupled together; and
a second trace coupled to the second trace rail.

11. The substrate layout of claim 10, wherein the second trace extends perpendicularly from the second trace rail.

12. The substrate layout of claim 10 further comprising a third trace coupled to the second trace rail.

13. The substrate layout of claim 8, wherein a first structure is selected from the group consisting of an additional via, an additional through-via, or a combination thereof, the first structure being directly coupled to the first trace rail, and being electrically coupled to a solder ball.

14. The substrate layout of claim 8, wherein a first structure is selected from the group consisting of an additional via, an additional through-via, or a combination thereof, the first structure being directly coupled to the first trace, and being electrically coupled to a solder ball.

15. The substrate layout of claim 8, wherein a first structure is selected from the group consisting of an additional via, an additional through-via, or a combination thereof, the first structure being directly coupled to the first trace, and being electrically coupled to a finger, wherein the finger is electrically coupled to the die.

* * * * *